(12) United States Patent
Tanoue et al.

(10) Patent No.: US 12,381,085 B2
(45) Date of Patent: Aug. 5, 2025

(54) BONDED SUBSTRATE PERIPHERAL LASER PROCESSING METHOD AND SUBSTRATE PROCESSING APPARATUS THEREOF

(71) Applicant: Tokyo Electron Limited, Tokyo (JP)

(72) Inventors: Hayato Tanoue, Kumamoto (JP); Yohei Yamashita, Kumamoto (JP); Yasutaka Mizomoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 494 days.

(21) Appl. No.: 17/995,171

(22) PCT Filed: Jan. 18, 2021

(86) PCT No.: PCT/JP2021/001526
§ 371 (c)(1),
(2) Date: Sep. 30, 2022

(87) PCT Pub. No.: WO2021/199585
PCT Pub. Date: Oct. 7, 2021

(65) Prior Publication Data
US 2023/0178374 A1    Jun. 8, 2023

(30) Foreign Application Priority Data
Apr. 2, 2020    (JP) .................................. 2020-066397

(51) Int. Cl.
*H01L 21/268* (2006.01)
*H01L 21/67* (2006.01)

(52) U.S. Cl.
CPC ...... *H01L 21/268* (2013.01); *H01L 21/67092* (2013.01)

(58) Field of Classification Search
CPC . H01L 21/268; H01L 21/67092; H01L 21/02; H01L 21/304; B23K 26/36; B23K 26/53; B23K 26/0624
See application file for complete search history.

(56) References Cited

U.S. PATENT DOCUMENTS

| | | | |
|---|---|---|---|
| 2021/0039203 A1 | 2/2021 | Tanoue | |
| 2021/0296119 A1 | 9/2021 | Tanoue | |
| 2024/0404852 A1* | 12/2024 | Yamashita | ........ H01L 21/67092 |

FOREIGN PATENT DOCUMENTS

| | | |
|---|---|---|
| JP | 2006-108532 A | 4/2006 |
| JP | 2006-212646 A | 8/2006 |

(Continued)

OTHER PUBLICATIONS

International Search Report of PCT/JP2021/ 001526 dated Apr. 13, 2021.

*Primary Examiner* — John P. Dulka
(74) *Attorney, Agent, or Firm* — Shih IP Law Group, PLLC.

(57) ABSTRACT

A substrate processing method of a combined substrate in which a first substrate having a surface film stacked thereon and a second substrate are bonded to each other includes separating the first substrate as a removing target from the second substrate; and removing or modifying at least a surface layer of the surface film at a peripheral portion of the second substrate by radiating laser light to an exposed surface of the surface film remaining at the peripheral portion of the second substrate, the exposed surface being exposed as a result of the separating of the first substrate.

18 Claims, 9 Drawing Sheets

(56) References Cited

FOREIGN PATENT DOCUMENTS

| JP | 2021190439 A | * | 12/2021 | |
|----|--------------|---|---------|---|
| WO | 2019176589 A1 | | 9/2019 | |
| WO | 2020012986 A1 | | 1/2020 | |
| WO | 2020017599 A1 | | 1/2020 | |
| WO | WO-2023013468 A1 | * | 2/2023 | ......... B23K 26/0648 |
| WO | WO-2024070309 A1 | * | 4/2024 | |

* cited by examiner

BONDED SUBSTRATE PERIPHERAL LASER PROCESSING METHOD AND SUBSTRATE PROCESSING APPARATUS THEREOF

CROSS-REFERENCE TO RELATED APPLICATIONS

This Application is a U.S. national phase application under 35 U.S.C. § 371 of PCT Application No. PCT/JP2021/001526 filed on Jan. 18, 2021, which claims the benefit of Japanese Patent Application No. 2020-066397 filed on Apr. 2, 2020, the entire disclosures of which are incorporated herein by reference.

TECHNICAL FIELD

The various aspects and embodiments described herein pertain generally to a substrate processing method and a substrate processing apparatus.

BACKGROUND

Patent Document 1 discloses a grinding method for a wafer. This grinding method for the wafer includes: a process of removing an outer periphery of the wafer by radiating, from one surface side of the wafer, a laser beam along an edge of the wafer at a position inside from the edge by a predetermined amount; and a process of grinding to a preset finishing thickness a grinding target surface of the wafer from which the outer periphery has been removed.

PRIOR ART DOCUMENT

Patent Document 1: Japanese Patent Laid-open Publication No. 2006-108532
Patent Document 2: Japanese Patent Laid-open Publication No. 2006-212646

DISCLOSURE OF THE INVENTION

Means for Solving the Problems

In an exemplary embodiment, a substrate processing method of a combined substrate in which a first substrate having a surface film stacked thereon and a second substrate are bonded to each other includes separating the first substrate as a removing target from the second substrate; and removing or modifying at least a surface layer of the surface film at a peripheral portion of the second substrate by radiating laser light to an exposed surface of the surface film remaining at the peripheral portion of the second substrate, the exposed surface being exposed as a result of the separating of the first substrate.

DETAILED DESCRIPTION

Recently, in a manufacturing process for a semiconductor device, in a combined wafer in which semiconductor substrates (hereinafter, referred to as "wafers") having a plurality of devices such as electronic circuits formed on front surfaces thereof are bonded to each other, thinning a first wafer forming the combined wafer, and transcribing the devices formed on the first wafer to a second wafer forming the combined wafer are performed.

Typically, a peripheral portion of the wafer is chamfered. If, however, the thinning processing and the transcription processing are performed on the combined wafer as stated above, a peripheral portion of the first wafer after being subjected to the thinning processing and a peripheral portion of the combined wafer after being subjected to the transcription processing may be given a sharp pointed shape (a so-called knife edge shape). If so, chipping takes place at the peripheral portions of these wafers, and the wafers may be damaged. Thus, it is necessary to perform a processing of suppressing the formation of the knife edge shape at the peripheral portions of the wafers in advance before the thinning processing and the transcription processing are performed.

The grinding method described in the aforementioned Patent Document 1 is, as an example method of suppressing the formation of the knife edge shape at the peripheral portion of the wafer caused by the thinning processing, a grinding method of performing so-called edge trimming of removing the peripheral portion of the wafer before being subjected to the thinning processing. However, when the edge trimming of the wafer is performed by the method described in Patent Document 1, particles or a residual film may remain on the exposed surface of the wafer after being subjected to the edge trimming. The particles or the residual film remaining on the surface of the wafer might contaminate a device, a FOUP or other wafers by being dropped or scattered during a transfer thereof or in a post-process. Therefore, there is still a room for improvement in the conventional edge trimming method.

The present disclosure provides a technique enabling to appropriately suppress scattering of particles or the like at a peripheral portion of a second substrate which is exposed by removing a first substrate from the second substrate in a combined substrate in which the first substrate and the second substrate are bonded to each other. Hereinafter, a wafer processing system as a substrate processing apparatus and a wafer processing method as a substrate processing method according to an exemplary embodiment will be described with reference to the accompanying drawings. Further, in the present specification and the drawings, parts having substantially the same functions and configurations will be assigned same reference numerals, and redundant description thereof will be omitted.

Figure 1:
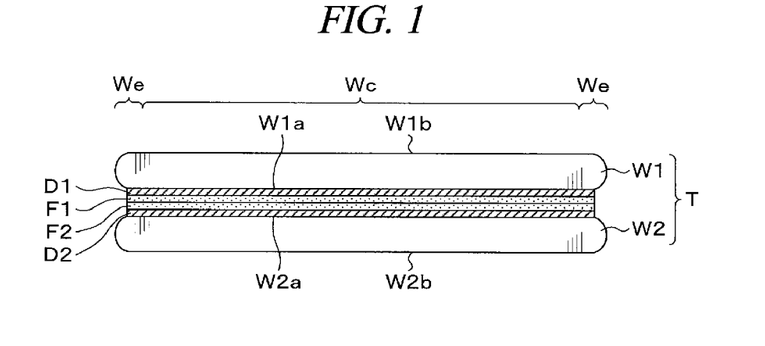
FIG. 1 is a side view illustrating an example of a combined wafer to be processed in a wafer processing system.

A wafer processing system 1 to be described later according to the present exemplary embodiment performs a required processing on a combined wafer T as a combined substrate in which a first wafer W1 as a first substrate and a second wafer W2 as a second substrate are bonded to each other, as illustrated in FIG. 1. In the wafer processing system 1, a peripheral portion We of the first wafer W1 is removed. Hereinafter, in the first wafer W1, a surface bonded to the second wafer W2 will be referred to as a front surface W1a, and a surface opposite to the front surface W1a will be referred to as a rear surface W1b. Likewise, in the second surface W2, a surface bonded to the first wafer W1 will be referred to as a front surface W2a, and a surface opposite to the front surface W2a will be referred to as a rear surface W2b. Also, in the first wafer W1, a region on the diametrically inner side than the peripheral portion We as a removing target will be referred to as a central portion Wc.

The first wafer W1 is a semiconductor wafer such as, but not limited to, a silicon wafer, and has, on the front surface W1a thereof, a device layer D1 including a plurality of devices. A bonding film F1 is further formed on the device layer D1, and the device layer D1 is bonded to the second wafer W2 with the bonding film F1 therebetween. The bonding film F1 may be, by way of non-limiting example, an oxide film (a $SiO_2$ film or a TEOS film), a SiC film, a SiCN film, or an adhesive. Moreover, the peripheral portion We of the first wafer W1 is chamfered, and the thickness of the peripheral portion We decreases as it goes toward a leading end thereof on a cross section thereof. Here, the peripheral portion We is a portion to be removed in edge trimming to be described later, and is in a range from, e.g., 0.5 mm to 3 mm from an edge of the first wafer W1 in a diametrical direction. Further, a laser absorption layer (not shown) capable of absorbing laser light radiated to the inside of the combined wafer T when removing the peripheral portion We may be further formed at an interface between the first wafer W1 and the device layer D1. The bonding film F1 formed on the device layer D1 may be used as the laser absorption layer.

The second wafer W2 has the same structure as the first wafer W1, for example. A device layer D2 and a bonding film F2 are formed on the front surface W2a, and a peripheral portion of the second wafer W2 is chamfered. Here, however, the second wafer W2 does not need to be a device wafer on which the device layer D2 is formed. By way of example, the second wafer W2 may be a support wafer that supports the first wafer W1. In this case, the second wafer W2 functions as a protection member for protecting the device layer D1 of the first wafer W1.

In addition, in the present exemplary embodiment, the device layers D1 and D2 and the bonding films F1 and F2 formed on the first wafer W1 and the second wafer W2, respectively, may sometimes be referred to as "surface films". That is, a plurality of surface films are stacked on the first wafer W1 and the second wafer W2 according to the present exemplary embodiment.

Figure 2:
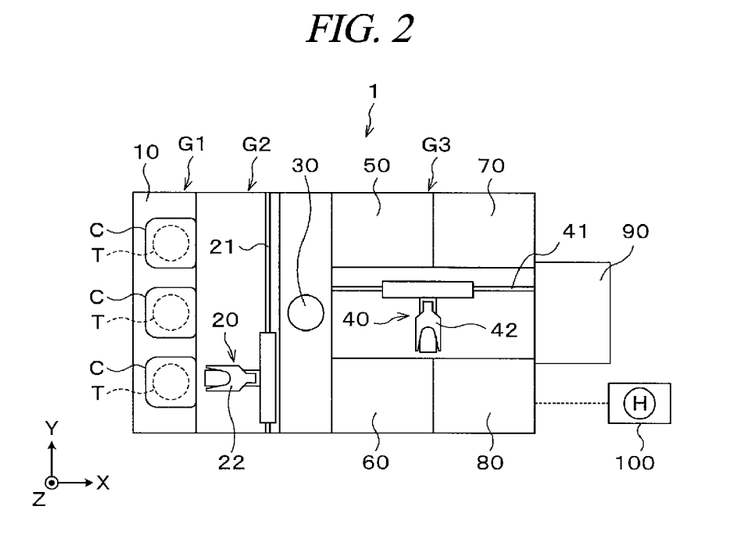
FIG. 2 is a plan view schematically illustrating a configuration of the wafer processing system.

As depicted in FIG. 2, the wafer processing system 1 includes a carry-in/out block G1, a transfer block G2 and a processing block G3 connected as one body. The carry-in/out block G1, the transfer block G2 and the processing block G3 are arranged in this sequence from the negative X-axis side.

In the carry-in/out block G1, a cassette C capable of accommodating therein a multiple number of combined wafers T is carried to/from, for example, the outside. In the carry-in/out block G1, a cassette placing table 10 is provided. In the shown example, a plurality of, for example, three cassettes C can be arranged on the cassette mounting table 10 in a row in the Y-axis direction. Further, the number of the cassettes C placed on the cassette placing table 10 is not limited to the example of the present exemplary embodiment but can be selected as required.

In the transfer block G2, a wafer transfer device 20 is provided adjacent to the cassette placing table 10 on the positive X-axis side of the cassette placing table 10. The wafer transfer device 20 is configured to be movable on a transfer path 21 which is elongated in the Y-axis direction. Further, the wafer transfer device 20 is equipped with, for example, two transfer arms 22 each of which is configured to hold and transfer the combined wafer T. Each transfer arm 22 is configured to be movable in a horizontal direction and a vertical direction and pivotable around a horizontal axis and a vertical axis. Further, the configuration of the transfer arm 22 is not limited to the example of the present exemplary embodiment, and various other configurations may be adopted. The wafer transfer device 20 is configured to be capable of transferring the combined wafer T to/from the cassette C of the cassette placing table 10 and a transition device 30 to be described later.

In the transfer block G2, the transition device 30 configured to deliver the combined wafer T is provided adjacent to the wafer transfer device 20 on the positive X-axis side of the wafer transfer device 20.

The processing block G3 has a wafer transfer device 40, a periphery removing apparatus 50 as a removing unit, a cleaning apparatus 60, an internal modifying apparatus 70, an interface modifying apparatus 80 as a second laser radiating unit and an oxide film removing unit, and a film processing apparatus 90 as a first laser radiating unit.

The wafer transfer device 40 is configured to be movable on a transfer path 41 which is elongated in the X-axis direction. Further, the wafer transfer device 40 is equipped with, for example, two transfer arms 42 each of which is configured to hold and transfer the combined wafer T. Each transfer arm 42 is configured to be movable in a horizontal direction and a vertical direction and pivotable around a horizontal axis and a vertical axis. Further, the configuration of the transfer arm 42 is not limited to the example of the present exemplary embodiment, and various other configurations may be adopted. The wafer transfer device 40 is configured to be capable of transferring the combined wafer T to/from the transition device 30, the periphery removing apparatus 50, the cleaning apparatus 60, the internal modifying apparatus 70, the interface modifying apparatus 80, and the film processing apparatus 90.

The periphery removing apparatus 50 performs an edge trimming processing of removing the peripheral portion We of the first wafer W1. The cleaning apparatus 60 cleans the combined wafer T. The internal modifying apparatus 70 radiates laser light (laser light for inside, for example, a YAG laser) to the inside of the first wafer W1 to form a peripheral modification layer M1 serving as a starting point for separation of the peripheral portion We and a split modification layer M2 serving as a starting point for breaking the peripheral portion We into smaller pieces. The interface modifying apparatus 80 radiates laser light (laser light for interface, for example, a $CO_2$ laser) to an interface between the first wafer W1 and the second wafer W2 to form a non-bonding region Ae to be described later. The film processing apparatus 90 radiates laser light (laser light for film processing, for example, a $CO_2$ laser) to an exposed surface (surface film) at a peripheral portion of the second wafer W2 which is exposed by the edge trim processing, and thus suppresses scattering of particles adhering to the exposed surface.

The above-described wafer processing system 1 is equipped with a control device 100 as a controller. The control device 100 is implemented by, for example, a computer, and includes a program storage (not shown). A program for controlling the processing of the combined wafer T in the wafer processing system 1 is stored in the program storage. Further, the program storage also stores therein a program for implementing a wafer processing to be described later in the wafer processing system 1 by controlling the above-described various processing apparatuses and a driving system such as the transfer devices. Further, the programs may be recorded in a computer-readable recording medium H, and may be installed from this recording medium H to the control device 100.

Now, the wafer processing performed by the wafer processing system 1 configured as described above will be explained. Further, in the present exemplary embodiment, the first wafer W1 and the second wafer W2 are bonded in a bonding apparatus (not shown) outside the wafer processing system 1 to form the combined wafer T in advance.

Figure 3A:
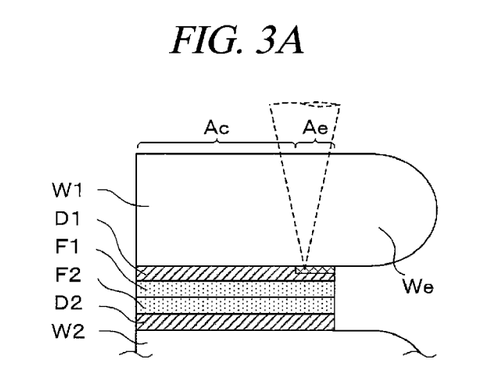
FIG. 3A to FIG. 3D are explanatory diagrams illustrating main processes of a wafer processing according to an exemplary embodiment.

First, the cassette C accommodating therein a plurality of combined wafers T is placed on the cassette placing table 10 of the carry-in/out block G1. Then, the combined wafer T in the cassette C is taken out by the wafer transfer device 20. The combined wafer T taken out from the cassette C is delivered to the wafer transfer device 40 via the transition device 30, and then transferred to the interface modifying apparatus 80. In the interface modifying apparatus 80, by radiating laser light (for example, a $CO_2$ laser having a wavelength of 8.9 μm to 11 μm) to the interface between the first wafer W1 and the device layer D1 (more specifically, the aforementioned laser absorption layer formed at the interface) while rotating the combined wafer T (the first wafer W1), the non-bonding region Ae is formed (process S1 of FIG. 4), as illustrated in FIG. 3A.

In the non-bonding region Ae, the interface between the first wafer W1 and the device layer D1 is modified or separated, so the bonding strength between the first wafer W1 and the second wafer W2 is reduced or eliminated. Accordingly, at the interface between the first wafer W1 and the device layer D1, the annular non-bonding region Ae is formed, and, also, a bonding region Ac in which the first wafer W1 and the second wafer W2 are bonded is formed on the inner side than the non-bonding region Ae in the diametrical direction. In the edge trimming to be described later, the peripheral portion We of the first wafer W1 as a removing target is removed. At this time, since the non-bonding region Ae is formed as described above, the peripheral portion We can be removed appropriately.

Figure 5A:
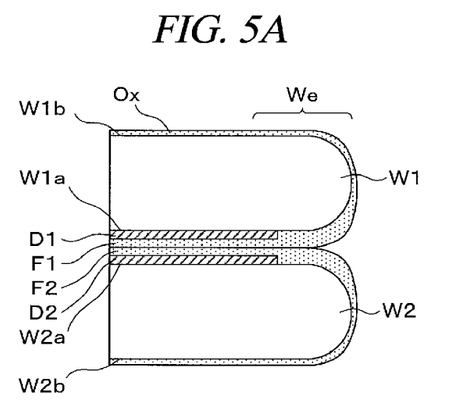
FIG. 5A and FIG. 5B are explanatory diagrams illustrating a laser transmission inhibition film formed on a rear surface of the first wafer.

In addition, on the rear surface W1b of the first wafer W1, as depicted in FIG. 5A, an oxide film (e.g., a $SiO_2$ film) may be naturally formed as a laser transmission inhibition film Ox due to, for example, contact with the atmosphere, or an oxide film (e.g., $SiO_2$ film) or a nitride film (e.g., $Si_3N_4$ film) configured to improve bending resistance or etching resistance of the wafer may be intentionally formed as the laser transmission inhibition film Ox. In the process S1, the laser light is radiated from the rear surface W1b side of the first wafer W1 to form the non-bonding region Ae. In this case, if the laser transmission inhibition film Ox is present on the rear surface W1b, the non-bonding region Ae may not be properly formed in some cases. Specifically, since the laser light radiated to the combined wafer T is absorbed and reflected by the laser transmission inhibition film Ox, the laser light cannot be appropriately radiated to the interface between the first wafer W1 and the device layer D1 where the non-bonding region Ae is supposed to be formed.

Figure 4:
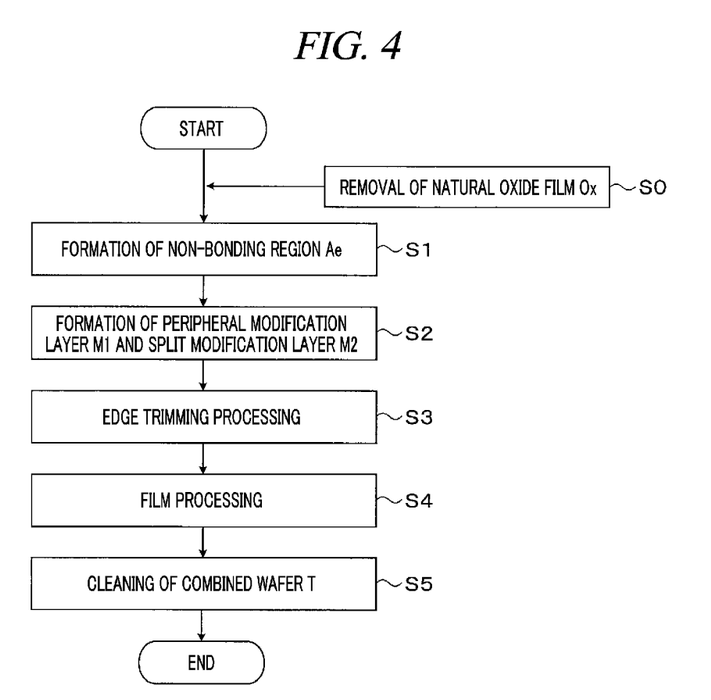
FIG. 4 is a flowchart illustrating main processes of the wafer processing according to the exemplary embodiment.

Thus, in the present exemplary embodiment, the laser transmission inhibition film Ox formed on the rear surface W1b of the first wafer W1 may be removed prior to the formation of the non-bonding region Ae (process S1) (process S0 in FIG. 4). The laser transmission inhibition film Ox can be removed by any method. For example, the laser transmission inhibition film Ox may be removed by radiating laser light ($CO_2$ laser) in the interface modifying apparatus 80. Further, as another example, an inhibition film removing apparatus (not shown) as an inhibition film removing unit may be provided outside the interface modifying apparatus 80 so as to be stacked on the cleaning apparatus 60, and the laser transmission inhibition film Ox may be removed in this inhibition film removing apparatus. As a method of removing the laser transmission inhibition film Ox in the inhibition film removing apparatus, a processing such as wet etching, grinding, polishing, or the like may be performed on the rear surface W1b of the first wafer W1 alone or in combinations. Moreover, a mechanism configured to perform the processing such as the wet etching, the grinding, the polishing, or the like may be provided inside the cleaning apparatus 60, for example.

Figure 5B:
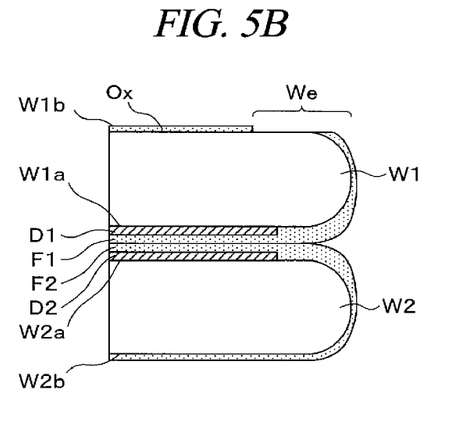

In addition, the removal of the laser transmission inhibition film Ox may be performed on the entire rear surface W1b of the first wafer W1, or may be performed only on the peripheral portion We of the first wafer W1 at least, which is the position to which the laser light is radiated, as shown in FIG. 5B. In comparison with the case of performing the removal of the laser transmission inhibition film Ox on the entire rear surface W1b, if the removal of the laser transmission inhibition film Ox is performed only on the peripheral portion We, a processing time can be shortened, and resources (the amount of a chemical liquid used and a radiation amount of the laser light) can be saved, so that cost-cut and energy saving can be achieved.

Figure 3B:
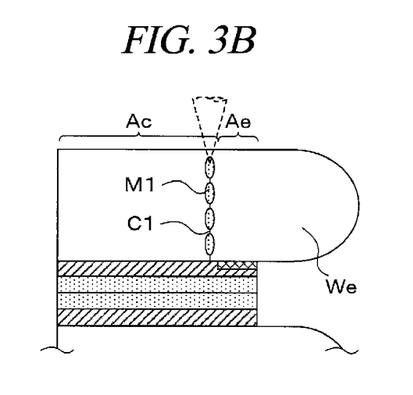
Figure 6:
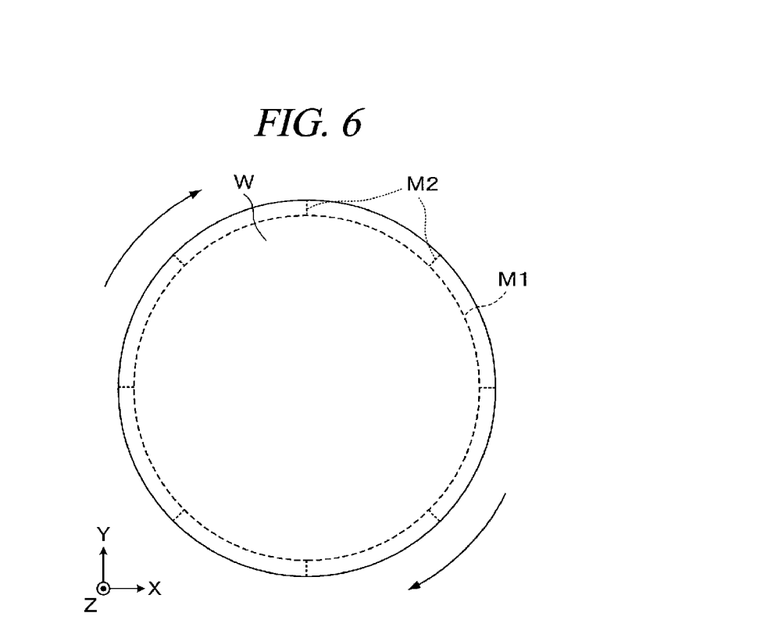
FIG. 6 is an explanatory diagram illustrating a peripheral modification layer formed inside the first wafer.

The combined wafer T having the non-bonding region Ae formed therein is then transferred to the internal modifying apparatus 70 by the wafer transfer device 40. In the internal modifying apparatus 70, the peripheral modification layer M1 and the split modification layer M2 are formed inside the first wafer W1, as shown in FIG. 3B and FIG. 6 (process S2 of FIG. 4). The peripheral modification layer M1 serves as a starting point when the peripheral portion We is removed in the edge trimming to be described later. The split modification layer M2 serves as a starting point for breaking the peripheral portion We to be removed into smaller pieces. In the drawings to be referred to in the following description, illustration of the split modification layer M2 may be omitted for the simplicity of illustration.

Here, the formation position of the peripheral modification layer M1 is decided to be slightly inside, in the diametrical direction, the inner edge of the non-bonding region Ae formed in the process S1. Although it is desirable that the peripheral modification layer M1 is formed at a position overlapping a boundary between the bonding region Ac and the non-bonding region Ae (hereinafter, simply referred to as "the boundary"), it may be formed while being deviated from the boundary in the diametrical direction due to, for example, a processing error or the like. If the peripheral modification layer M1 is thus formed at a position away from the boundary in the diametrically outward direction, that is, in the non-bonding region Ae, the first wafer W1 may not be firmly bonded to the second wafer W2 after the peripheral portion We is removed. However, by controlling the peripheral modification layer M1 to be formed diametrically inside the boundary, even if the formation position is deviated due to, for example, the processing error, the peripheral modification layer M1 can still be formed at the position overlapping the boundary or at a position adjacent to the boundary even if it is radially outside the boundary. Thus, it is possible to suppress the peripheral modification layer M1 from being formed at the position away from the boundary in the diametrically outward direction.

Further, from the peripheral modification layer M1 formed inside the first wafer W1, a crack C1 develops in the thickness direction of the first wafer W1, as shown in FIG. 3B. A lower end of the crack C1 reaches, for example, the front surface W1a of the first wafer W1.

Figure 3C:
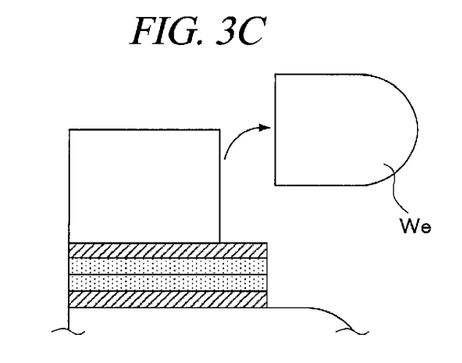

The combined wafer T having the peripheral modification layer M1 and the split modification layer M2 formed inside the first wafer W1 is then transferred by the wafer transfer device 40 to the periphery removing apparatus 50. In the periphery removing apparatus 50, removing of the peripheral portion We of the first wafer W1, that is, an edge trimming processing is performed as shown in FIG. 3C (process S3 of FIG. 4). At this time, the peripheral portion We is separated from the central portion Wc of the first wafer W1 starting from the peripheral modification layer M1 and the crack C1, and also separated from the device layer D1 (second wafer W2) starting from the non-bonding region Ae. At this time, the peripheral portion We being removed is broken into smaller pieces starting from the split modification layer M2 and a crack.

In the removal of the peripheral portion We, a wedge-shaped blade, for example, may be inserted into the interface between the first wafer W1 and the second wafer W2 of the combined wafer T. Further, an air blow or a water jet may be sprayed to pressurize and remove the peripheral portion We. In this way, in the edge trimming, by applying an impact to the peripheral portion We of the first wafer W1, the peripheral portion We is appropriately separated starting from the peripheral modification layer M1 and the crack C1. Further, since the bonding strength between the first wafer W1 and the second wafer W2 is reduced due to the non-bonding region Ae as described above, the peripheral portion We is appropriately removed.

Figure 3D:
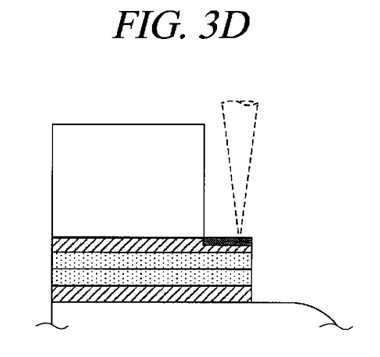

The combined wafer T from which the peripheral portion We of the first wafer W1 has been removed is then transferred to the film processing apparatus 90 by the wafer transfer device 40. In the film processing apparatus 90, a processing (hereinafter, sometimes referred to as "film processing") of suppressing the scattering of the particles at the peripheral portion of the second wafer W2 after the peripheral portion We is removed is performed, as shown in FIG. 3D (process S4 in FIG. 4).

Figure 7:
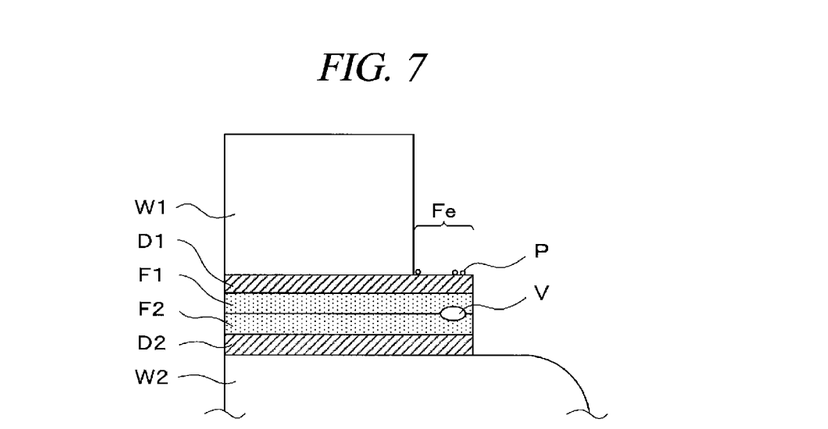
FIG. 7 is an explanatory diagram illustrating particles and an edge void left in the combined wafer.

A residual film or particles P (hereinafter, referred to as "particles, etc.") are left on the front surface of the second wafer W2 after the removal of the peripheral portion We, specifically, on an exposed surface Fe of the surface films remaining on the peripheral portion of the second wafer W2 exposed by the removal of the first wafer W1, as illustrated in FIG. 7. These particles, etc. may cause contamination of the inside of the wafer processing system 1, the inside of the cassette C, or other combined wafers T by being separated, dropped or scattered during the transfer or processing of the combined wafer T.

In addition, as shown in FIG. 7, an edge void V (air layer) formed when the first wafer W1 and the second wafer W2 are bonded may remain at a bonding interface between the first wafer W1 and the second wafer W2 after the peripheral portion We is removed. This edge void V may be burst under the influence of pressurization or decompression, or heating or cooling of the combined wafer T in post-processes, resulting in particle generation or the like.

To solve the problem, the present inventors have conducted intensive research and found out the following two methods as a way to suppress the scattering of the particles, etc. after the removal of the peripheral portion We.

Figure 8A:
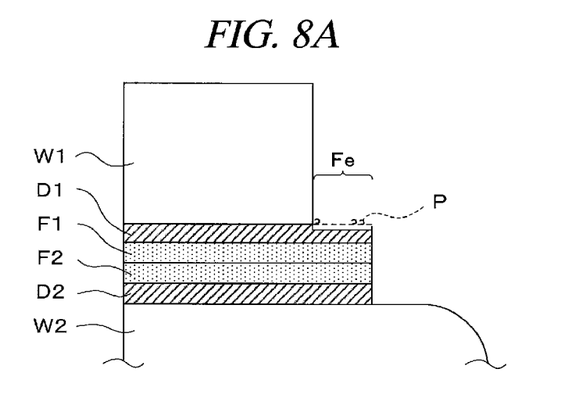
FIG. 8A to FIG. 8C are explanatory diagrams illustrating a particle suppression processing according to the exemplary embodiment.

The first method is to remove the exposed surface Fe, which can be a source of the particle generation, etc. For example, by radiating laser light (for example, a $CO_2$ laser) to the exposed surface Fe, at least the surface layer of the surface film on which the particles, etc. remain is removed, as shown in FIG. 8A.

Figure 8B:
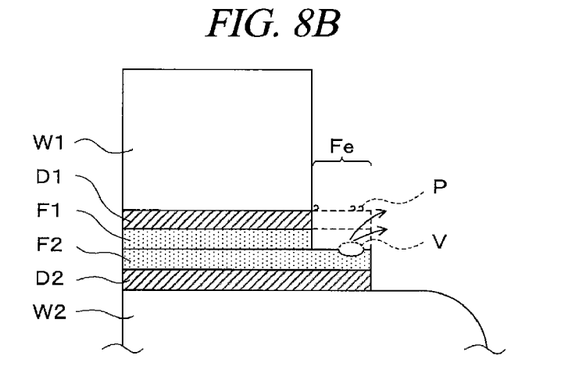

Further, as an example, when the edge void V exists in the bonding interface between the first wafer W1 and the second wafer W2, the surface films (the device layer D1 and the bonding film F1) of the first wafer W1 may be removed by radiating laser light to the bonding interface, as illustrated in FIG. 8B.

Figure 8C:
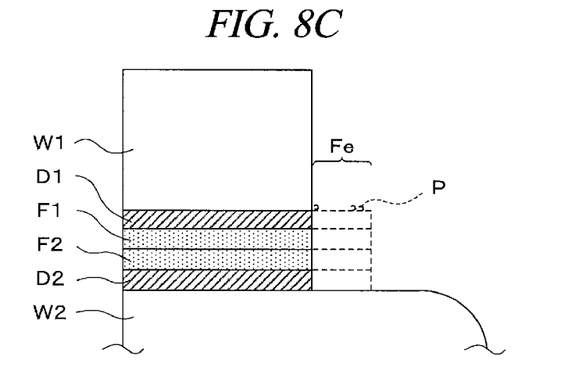

Further, as an example, by radiating laser light (for example, a $CO_2$ laser) to the exposed surface Fe, all the surface films (the device layers D1 and D2 and the bonding films F1 and F2) left on the peripheral portion of the second wafer W2 after the removal of the peripheral portion We may be removed, as illustrated in FIG. 8C.

In this case, since the particles, etc. remaining on the exposed surface Fe are removed together with the surface films which are removed by the radiation of the laser light, the particles, etc. are suppressed from being peeled off, dropped, or scattered.

Further, by removing the surface films in this way, the edge void V (bonding interface) is exposed as shown in FIG. 8B. Accordingly, the air accumulated in the edge void V is released, so that the bursting of the edge void V is suppressed.

In addition, by removing all the surface films remaining on the peripheral portion of the second wafer W2 as shown in FIG. 8C, the peeling, the falling or the scattering of the particles P or the like from the peripheral portion of the second wafer W2 can be avoided in the post-processes.

Figure 9A:
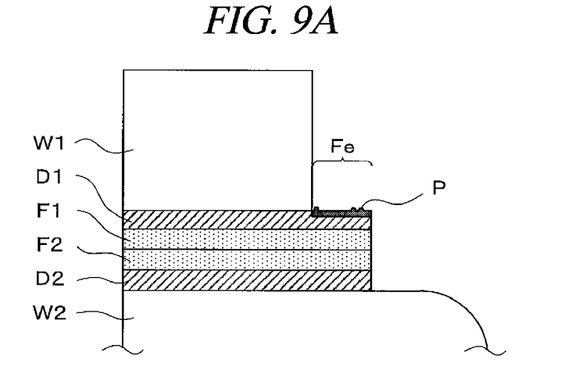
FIG. 9A to FIG. 9C are explanatory diagrams illustrating a particle suppression processing according to the exemplary embodiment.

The second method is to modify the exposed surface Fe, which can be a source of the particle generation, etc. For example, by radiating laser light (for example, a $CO_2$ laser) to the exposed surface Fe, at least the surface layer of the surface film on which the particles, etc. are left is melted, as shown in FIG. 9A, and, further, the molten portion thereof is fixed (hereinafter, the "melting" and the "fixing" of this surface film will be together referred to as "modification of the surface film").

Figure 9B:
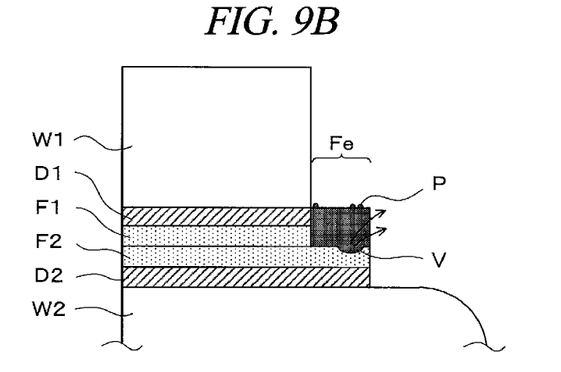

Further, as an example, when the edge void V exists in the bonding interface between the first wafer W1 and the second wafer W2, the surface films (the device layer D1 and the bonding film F1) of the first wafer W1 may be integrally modified as shown in FIG. 9B by radiating the laser light to the inside of the surface films of the first wafer W1. In other words, after the exposed portions of the device layer D1 and the bonding film F1 remaining on the second wafer W2 after the removal of the peripheral portion We are melted by the radiation of the laser light, the molten device layer D1 and bonding film F1 may be formed as an integral fixed object.

Figure 9C:
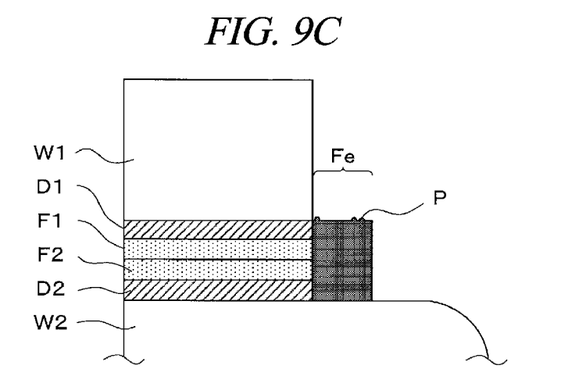

Further, as an example, by radiating laser light (for example, a $CO_2$ laser) to the exposed surface Fe, all the surface films (the device layers D1 and D2 and the bonding films F1 and F2) remaining on the peripheral portion of the second wafer W2 after the removal of the peripheral portion We may be integrally modified, as shown in FIG. 9C. In other words, after the exposed portions of the device layers D1 and D2 and the bonding films F1 and F2 remaining on the second wafer W2 after the removal of the peripheral portion We are melted by the radiation of the laser light, the molten device layers D1 and D2 and bonding films F1 and F2 may be formed as an integral fixed object.

In this case, since the particles, etc. remaining on the exposed surface Fe are fixed together with the surface films melted by the radiation of the laser light, that is, since the surface films and the particles, etc. are formed as the integral fixed object, the scattering of these particles, etc. may be suppressed.

Further, by integrally modifying the surface films of the first wafer W1 as shown in FIG. 9B, the air accumulated in the edge void V is released to the outside during the process accompanying this modification of the surface films, so that the bursting of the edge void V may be suppressed.

In addition, by integrally modifying all the surface films remaining on the peripheral portion of the second wafer W2 as illustrated in FIG. 9C, the peeling, the falling or the scattering of the particles P, etc. from the peripheral portion of the second wafer W2 can be avoided in the post-processes.

The combined wafer T in which the surface films on the exposed surface Fe have been removed or modified is then transferred to the cleaning apparatus 60 by the wafer transfer device 40. In the cleaning apparatus 60, the rear surface W1$b$ and the exposed portion of the first wafer W1 after being subjected to the removal of the peripheral portion We and the film processing are cleaned (process S5 in FIG. 4). Further, in the cleaning apparatus 60, the rear surface W2$b$ of the second wafer W2 as well as the rear surface W1$b$ of the first wafer W1 may be cleaned.

Thereafter, the combined wafer T after being subjected to all the required processes of the wafer processing is transferred to the cassette C of the cassette placing table 10 by the wafer transfer device 20 via the transition device 30. In this way, the series of processes of the wafer processing in the wafer processing system 1 are completed.

According to the above-described exemplary embodiment, the scattering of the particles, etc. can be appropriately suppressed by removing or modifying, through the radiation of the laser light, at least the surface layer of the portion exposed after the removal of the peripheral portion We. At this time, by integrally removing or modifying the whole region from the exposed surface Fe to the bonding interface between the first wafer W1 and the second wafer W2, the air accumulated in the edge void V can be released, so that the generation of the particles resulting from the edge void V can also be suppressed appropriately.

In addition, in the above-described exemplary embodiment, the non-bonding region Ae in which the bonding strength between the first wafer W1 and the second wafer W2 is reduced is formed prior to the edge trimming. Thus, since the peripheral portion We is easily removed from the second wafer W2, the particles, etc. are suppressed from being left at the separation interface (exposed surface Fe). That is, the scattering of the particles, etc. after the removal of the peripheral portion We is more appropriately suppressed.

Furthermore, since the laser transmission inhibiting film Ox formed on the rear surface W1$b$ of the first wafer W1 is removed prior to the formation of the non-bonding region Ae, the formation of the non-bonding region Ae can be appropriately performed.

Moreover, in the above-described exemplary embodiment, the formation of the non-bonding region Ae is performed by the interface modifying apparatus 80, whereas the film processing of the exposed surface Fe is performed by the film processing apparatus 90. If, however, the formation of the non-bonding region Ae and the film processing are both performed by the radiation of the laser light ($CO_2$ laser), it is possible to adopt a configuration in which the formation of the non-bonding region Ae and the film processing are performed in one and the same apparatus. As a specific example, the combined wafer T from which the peripheral portion We of the first wafer W1 has been removed may be transferred from the periphery removing apparatus 50 to the interface modifying apparatus 80 again by the wafer transfer device 40 to be subjected to the film processing in the interface modifying apparatus 80.

Additionally, the above exemplary embodiment has been described for the case of processing the surface films remaining on the peripheral portion of the second wafer W2 as a result of separating the peripheral portion We of the first wafer W1 from the second wafer W2 in the combined wafer T in which the first wafer W1 and the second wafer W2 are bonded to each other. However, the application of the technique according to the present disclosure is not limited thereto. By way of example, the technique according to the present disclosure can also be applied to the case of separating the entire surface of the first wafer W1 from the second wafer W2 to transcribe the device layer D1 formed on the first wafer W1 to the second wafer W2.

Figure 10A:
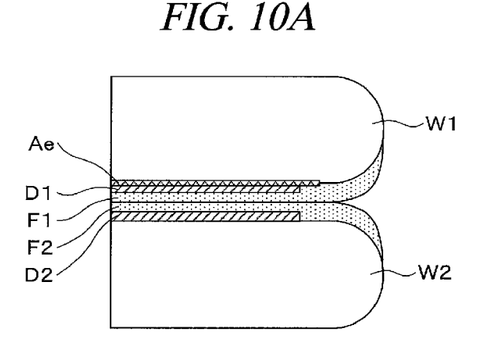
FIG. 10A to FIG. 10C are explanatory diagrams illustrating another application example of the technique according to the present disclosure.
Figure 10B:
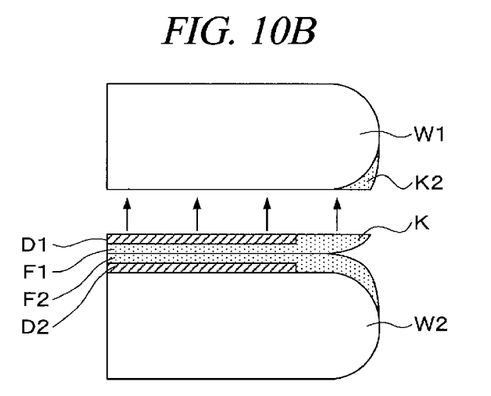

To elaborate, in the transcription of the device layer D1 to the second wafer W2, the separation of the first wafer W1 is performed starting from the non-bonding region Ae formed at the entire interface between the first wafer W1 and the device layer D1, as illustrated in FIG. 10A. At this time, however, the bonding film F1, for example, may not be firmly bonded to the second wafer W2 at the formation interface of the non-bonding region Ae, resulting in formation of a knife edge shape K, as shown in FIG. 10B. If the knife edge shape K is formed at the peripheral portion of the second wafer W2 after the removal of the first wafer W1 in this way, chipping may occur at the peripheral portion of the second wafer W2, raising a risk that the particles may adhere to the peripheral portion of the second wafer W2 after the separation of the first wafer W1.

Figure 10C:
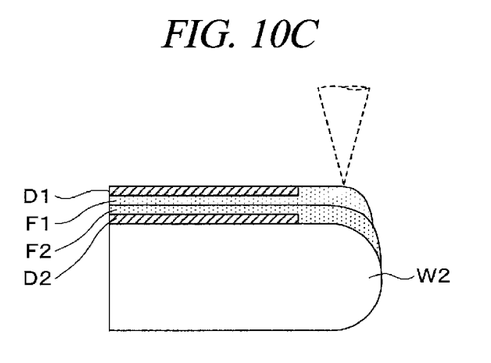

As a resolution, by performing the above-stated film processing on the peripheral portion of the second wafer W2 after the transcription of the device layer D1, the scattering of the particles resulting from the knife edge shape K can be suppressed. That is, as illustrated in FIG. 10C, by radiating laser light to the peripheral portion of the second wafer W2 in which the knife edge shape K is formed by separating the first wafer W1 to thereby remove or modify the surface films (knife edge shape K) remaining on the peripheral portion of the second wafer W2, preferably, a gap between the bonding film F1 and the bonding film F2 is removed, and thus, the scattering of the particles, etc. can be suppressed appropriately.

Further, as shown in FIG. 10B, the non-bonding region Ae may not be appropriately formed at a portion where the first wafer W1 and the second wafer W2 are not bonded (for example, the chamfered portion at the periphery), which raises a likelihood that a residual film K2 may be left on a peripheral portion or the front surface of the first wafer W1 after being separated. If the residual film K2 is left on the first wafer W1 in this way, the particle generation may also be caused. Thus, in the wafer processing system 1 according to the present exemplary embodiment, a processing, such as, but not limited to, wet etching, of removing the residual film K2 remaining on the first wafer W1 after being separated may be further performed.

In addition, as shown in FIG. 9C, when all the surface films remaining on the peripheral portion of the second wafer W2 are removed by the radiation of the laser light (for example, the $CO_2$ laser), in other words, if the front surface W2a of the second wafer W2 is exposed by removing those surface films, there is a risk that the flatness of the front surface W2a of the second wafer W2 may be deteriorated (the front surface W2a may become rough) by the radiation of the laser light. If the flatness of the front surface W2a is deteriorated in this way, there is a risk that the wafer processing in the post-processes may not be performed properly, specifically, the film formation on the front surface W2a may not be carried out appropriately.

To solve the problem, in the present exemplary embodiment, by controlling radiation conditions for the laser light in the removal of the surface films (the bonding films F1 and F2 and the device layers D1 and D2) remaining on the front surface W2a of the second wafer W2, a fine periodic structure is formed on the front surface W2a from which the surface films have been removed. The fine periodic structure is, for example, a surface structure composed of nanoscale or smaller prominences and depressions (see, for example, Patent Document 2). By forming this fine periodic structure, the flatness of the front surface W2a can be improved.

Below, a method of removing all the surface films remaining on the peripheral portion of the second wafer W2 after the removal of the peripheral portion We of the first wafer W1 and forming the fine periodic structure on the front surface W2a of the second wafer W2 exposed after the surface films are removed will be described.

Figure 11:
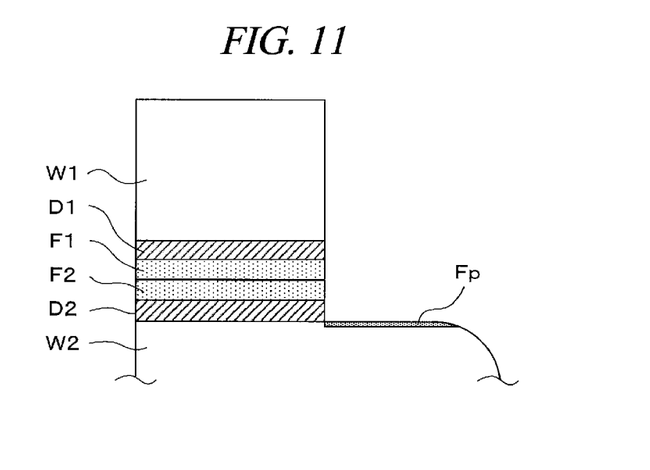
FIG. 11 is an explanatory diagram illustrating a particle suppression processing according to the exemplary embodiment.

For the complete removal of the surface films remaining on the peripheral portion of the second wafer W2, laser light (for example, an ultra-short pulse laser such as a femtosecond laser or a picosecond laser) is radiated to the exposed surface Fe of the surface films after the removal of the peripheral portion We. As a result, all the surface films (the device layers D1 and D2 and the bonding films F1 and F2) remaining on the peripheral portion of the second wafer W2 are completely removed, as shown in FIG. 11.

At this time, in order to suppress the deterioration of the flatness of the front surface W2a of the second wafer W2 that might be caused by the radiation of the radiated laser light, the radiation conditions of the laser light are controlled to enable formation of a fine periodic structure Fp (see FIG. 11) on the front surface W2a. Specifically, the fluence (energy density) and overlap (overlapping of pulse laser radiation areas) of the laser light radiated to the surface films are adjusted to required conditions.

Then, by further radiating the laser light to the front surface W2a of the second wafer W2 under these radiation conditions, the fine periodic structure Fp is formed on the front surface W2a from which the surface films have been removed.

As described above, in the present exemplary embodiment, the deterioration of the flatness of the front surface W2a is suppressed by radiating the laser light to the front surface W2a under the required conditions for forming the fine periodic structure Fp.

Further, the radiation conditions (fluence and overlap) of the laser light in the formation of the fine periodic structure Fp on the front surface W2a may be the same as the radiation conditions of the laser light in the removal of the surface films remaining on the peripheral portion of the second wafer W2 as described above. In other words, the removal of the surface films and the formation of the fine periodic structure Fp may be performed continuously without changing the radiation conditions for the laser light on the way.

However, the radiation conditions of the laser light are not limited thereto, and different radiation conditions may be set for the removal of the surface films and the formation of the fine periodic structure Fp individually.

As a specific example, in the removal of the surface films remaining on the peripheral portion of the second wafer W2, the laser light may be radiated under radiation conditions enabling to shorten the time required for the removal of the surface films, that is, under processing conditions causing an increase of the volume of the surface films to be removed in the radiation of the laser light. In this case, the radiation conditions may be, for example, conditions under which the fine periodic structure Fp cannot be formed on the front surface W2a.

Then, in removing the residual film remaining on the front surface W2a and, also, in performing a surface processing of the front surface W2a (formation of the fine periodic structure Fp) after removing the surfaces film approximately, the radiation conditions may be adjusted to the conditions under which the fine periodic structure Fp can be formed.

In other words, in each of the removal of the surface films and the formation of the fine periodic structure Fp, the fluence and the overlap of the laser light may be changed to become the required conditions, whereby the entire processing time of the laser processing can be shortened.

In addition, in the shown example, the fine periodic structure Fp is formed on the entire surface of the peripheral portion of the second wafer W2 from which the surface films (the device layers D1 and D2 and the bonding films F1 and F2) are removed. However, the formation range of the fine periodic structure Fp is not limited thereto. By way of example, the fine periodic structure Fp may be formed only at a part of the peripheral portion of the second wafer W2 depending on the purpose of the wafer processing or the like.

In addition, in the above-described exemplary embodiment, the non-bonding region Ae is formed at the interface between the first wafer W1 and the device layer D1 and the removal of the peripheral portion We (edge trimming) is performed at this interface, as illustrated in FIG. 3A to FIG. 3D, for example. However, the removing interface of the peripheral portion We of the first wafer W1 is not limited thereto. That is, the non-bonding region Ae may be formed at an interface between the device layer D1 and the bonding film F1 or at an interface between the device layer D2 and the bonding film F2, for example, and the removing of the peripheral portion We (edge trimming) may be performed at this interface where the non-bonding region Ae is formed.

Even in such a case, by radiating laser light to the exposed surface Fe after the removal of the peripheral portion We, scattering of particles and the like can be suppressed as shown in FIG. 8A to FIG. 9C.

Furthermore, by removing the peripheral portion We at the interface located closer to the second wafer W2 than the interface between the first wafer W1 and the device layer D1 as described above, the thickness of the surface films remaining on the peripheral portion of the second wafer W2 becomes smaller. That is, since the volume of the surface films remaining on the peripheral portion of the second wafer W2 is reduced, the volume of the surface films to be removed decreases when removing the surface films completely as stated above, resulting in improvement of a throughput regarding the removal of the surface films.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiments, it is possible to appropriately suppress the scattering of the particles or the like at the peripheral portion of the second substrate which is exposed by removing the first substrate from the second substrate in the combined substrate in which the first substrate and the second substrate are bonded to each other.

We claim:

1. A substrate processing method of a combined substrate in which a first substrate having a surface film stacked thereon and a second substrate are bonded to each other, the substrate processing method comprising:
   separating the first substrate as a removing target from the second substrate; and
   removing or modifying at least a surface layer of the surface film at a peripheral portion of the second substrate by radiating laser light to an exposed surface of the surface film remaining at the peripheral portion of the second substrate, the exposed surface being exposed as a result of the separating of the first substrate.

2. The substrate processing method of claim 1, wherein, in the separating of the first substrate, at least a peripheral portion of the first substrate is separated from the second substrate.

3. The substrate processing method of claim 1, wherein, in the removing or the modifying of the surface film, the surface film ranging from the exposed surface to a bonding interface between the first substrate and the second substrate is removed or modified.

4. The substrate processing method of claim 1, wherein, in the removing or the modifying of the surface film, the surface film remaining at the peripheral portion of the second substrate is completely removed to expose a surface of the second substrate.

5. The substrate processing method of claim 4, wherein, in the removing of the surface film, energy density of the laser light and overlap of laser radiation areas are controlled by radiating the laser light in a pulse shape.

6. The substrate processing method of claim 4, wherein the laser light is an ultra-short pulse laser.

7. The substrate processing method of claim 6, wherein the removing of the surface film remaining at the peripheral portion of the second substrate comprises:
   removing the surface film by radiating the laser light to the surface film; and
   sequentially performing removing a residual film of the surface film and forming a fine periodic structure on the surface of the second substrate, by radiating the laser light to the surface of the second substrate from which the surface film is removed.

8. The substrate processing method of claim 1, further comprising:
   prior to the removing of the surface film,
   removing an inhibition film of the laser light formed on a rear surface of the first substrate; and
   radiating laser light to an inside of the combined substrate to reduce a bonding strength between the first substrate and the second substrate at the peripheral portion.

9. The substrate processing method of claim 8, wherein the removing of the inhibition film is performed at a position of the first substrate corresponding to the peripheral portion.

10. A substrate processing apparatus configured to process a combined substrate in which a first substrate having a surface film stacked thereon and a second substrate are bonded to each other, the substrate processing apparatus comprising:
    a removing unit configured to separate the first substrate as a removing target from the second substrate;
    a first laser radiating unit configured to radiate laser light to an exposed surface of the surface film remaining at a peripheral portion of the second substrate, the exposed surface being exposed by separating the first substrate; and
    a controller configured to control operations of the removing unit and the first laser radiating unit,
    wherein the controller controls the operation of the first laser radiating unit to remove or modify, by radiating the laser light, at least a surface layer of the surface film at the peripheral portion of the second substrate, which is exposed by separating the first substrate.

11. The substrate processing apparatus of claim 10, wherein the controller controls the operation of the removing unit to separate at least a peripheral portion of the first substrate from the second substrate.

12. The substrate processing apparatus of claim 10, wherein the controller controls the operation of the first laser radiating unit to remove or modify the surface film ranging from the exposed surface to a bonding interface between the first substrate and the second substrate by radiating the laser light.

13. The substrate processing apparatus of claim 10, wherein the controller controls the operation of the first laser radiating unit to completely remove the surface film remaining at the peripheral portion of the second substrate by radiating the laser light to thereby expose a surface of the second substrate.

14. The substrate processing apparatus of claim 13, wherein the controller controls the operation of the first laser radiating unit to radiate the laser light in a pulse shape when removing the surface film to control energy density of the laser light and overlap of laser radiation areas.

15. The substrate processing apparatus of claim 13, wherein the laser light is an ultra-short pulse laser.

16. The substrate processing apparatus of claim 15, wherein, when removing the surface film remaining at the peripheral portion of the second substrate, the controller controls the operation of the first laser radiating unit to remove the surface film by radiating the laser light to the surface film, to remove a residual film of the surface film by radiating the laser light to the surface of the second substrate from which the surface film is removed, and to form a fine periodic structure on the surface of the second substrate.

17. The substrate processing apparatus of claim 10, further comprising:
    an inhibition film removing unit configured to remove an inhibition film of the laser light formed on a rear surface of the first substrate; and
    a second laser radiating unit configured to radiate laser light to an inside of the combined substrate to reduce a bonding strength between the first substrate and the second substrate at the peripheral portion.

18. The substrate processing apparatus of claim 17, wherein the controller controls an operation of the inhibition film removing unit to remove the inhibition film at a position of the first substrate corresponding to the peripheral portion.

* * * * *